United States Patent [19]
Kim et al.

[11] Patent Number: 6,096,161
[45] Date of Patent: Aug. 1, 2000

[54] DRY ETCHING APPARATUS HAVING MEANS FOR PREVENTING MICRO-ARCING

[75] Inventors: Hag-pil Kim; Tae-ryong Kim; Young-woo Lee, all of Kyungki-do, Rep. of Korea

[73] Assignee: Samsung Electronics Co., Ltd., Suwon, Rep. of Korea

[21] Appl. No.: 09/185,091

[22] Filed: Nov. 3, 1998

[30] Foreign Application Priority Data

Dec. 24, 1997 [KR] Rep. of Korea ...... 97-73532

[51] Int. Cl.⁷ ...... C23F 1/02
[52] U.S. Cl. ...... 156/345
[58] Field of Search ...... 156/345

[56] References Cited

U.S. PATENT DOCUMENTS 5,534,751  7/1996  Lenz et al. ............ 315/111.71
5,895,549  4/1999  Goto et al. ............ 156/345
5,919,332  7/1999  Koshishi et al. ....... 156/345

*Primary Examiner*—Shrive Beck
*Assistant Examiner*—Norca L. Torres-Velazquez
*Attorney, Agent, or Firm*—Jones Volentine, LLP

[57] ABSTRACT

A dry etching apparatus used for manufacture of a semiconductor device includes a plasma confinement ring secured by screws to a cathode, an anode, and a metal focusing ring extending around the anode for enhancing the uniformity of the plasma. The screws are located a maximum distance away from the focusing ring. Thus, micro-arcing is prevented from occurring between the focusing ring and the screws. The confinement ring is also designed to distribute the plasma stream only onto the wafer, so that the generation of contamination particles is suppressed during etching.

6 Claims, 5 Drawing Sheets

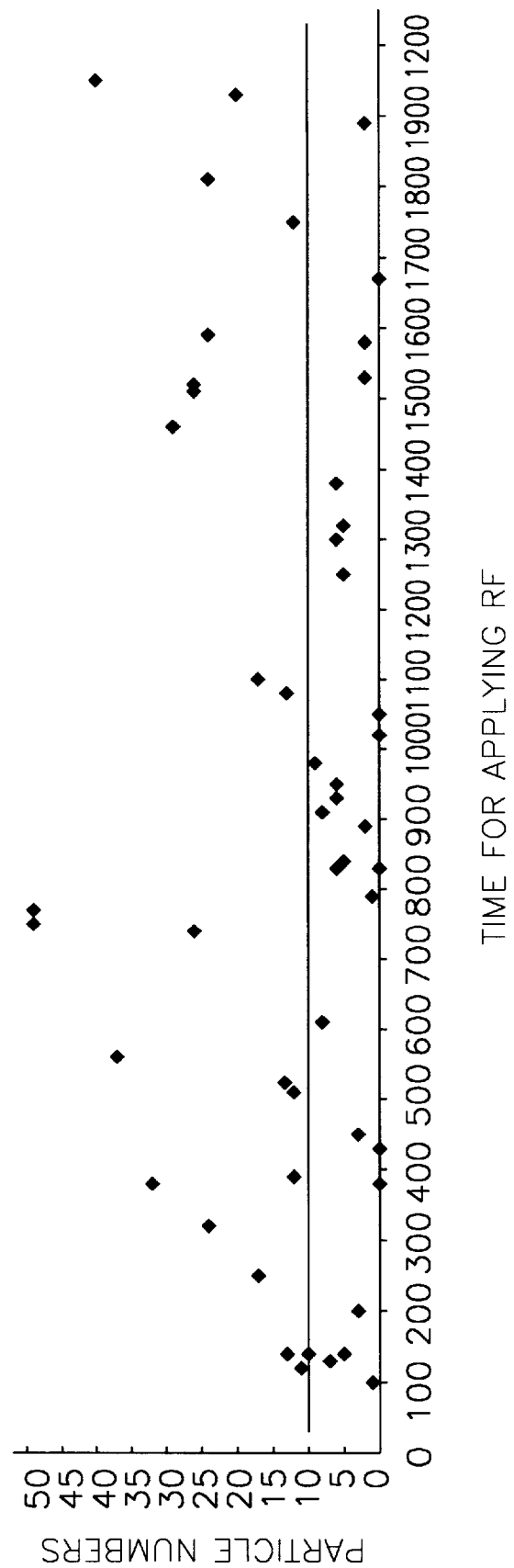

DRY ETCHING APPARATUS HAVING MEANS FOR PREVENTING MICRO-ARCING

BACKGROUND OF THE INVENTION

1. Field of the Invention

The present invention relates to an apparatus for manufacturing a semiconductor device, and more particularly, to a dry etching apparatus.

2. Description of the Related Art

A dry etching apparatus uses plasma to carry out various processes in the manufacturing of a semiconductor device. In a dry etching process, a reaction gas is injected into the dry etching apparatus and external power having the frequency of a radio wave is applied to a silicon cathode and an anode of the dry etching apparatus. The energy of electrons accelerated by an RF electric field formed between the cathode and the anode is increased as the electrons elastically collide repeatedly against molecules of the reaction gas. Then, the highly energized electrons collide non-elastically with the molecules of the reaction gas whereby the molecules of the reaction gas are ionized and excited to generate plasma. Negatively charged plasma gases flow to the anode due to a difference in potential between the cathode and the anode. There, the plasma reacts with a wafer located on the anode to generate a material having a high vapor pressure and a volatile material, to thereby etch the wafer.

If the dry etching process described above is to be performed accurately and effectively, the plasma stream must be confined to the wafer supported on the anode and impurities must be suppressed.

However, an examination of a conventional dry etching apparatus (FIG. 1) reveals that sunflower-shaped particles of a polymer and particle contaminants 30 are deposited on an aluminum ring 14 extending along the periphery of an electrostatic chuck (ESC) 12 provided in the lower portion 10 of a processing chamber of the apparatus, and on a plasma confinement ring 24 supporting a silicon cathode 22 in an upper portion 20 of the processing chamber. The aluminum ring 14 is provided to enhance the uniformity of the plasma density, whereas the confinement ring 24 is provided to confine the plasma stream to the area of the wafer.

The present inventor has determined that the deposition of the polymer and of the particle contaminants 30 are caused by occurrences of micro-arcing between screws 26, which fix the confinement ring 24 in place, and the aluminum ring 14 extending along the periphery of the electrostatic chuck 12. The micro-arcing acts at openings for air stream control which are formed in the silicon cathode 22 and an aluminum baffle, mounted on the silicon cathode 22, to control the flow of gas. The particles of silicon or aluminum which are produced as a result of the micro-arcing contaminate the wafer during the dry etching process. Also, the plasma confinement ring 24 does not completely confine the plasma stream to just the area of the wafer. Rather, the plasma diffuses onto the aluminum ring 14. There, some of the plasma combines with the particle contaminants. The plasma and the plasma combined with the particle contaminants are burned by the micro-arcing to form the sunflower-shaped polymer and particles 30 shown in FIG. 1.

The contamination of the wafer, and the presence of the polymer and particle contaminants 30 adversely affects the dry etching process to the point where the yield of satisfactorily etched products is below expectations.

SUMMARY OF THE INVENTION

It is therefore one object of the present invention to provide a dry etching apparatus in which micro-arcing is suppressed.

It is another object of the present invention to provide a dry etching apparatus which prevents a wafer being etched from becoming contaminated.

To achieve these objects, the present invention provides a dry etching apparatus including a plasma confinement ring secured by screws to a cathode, an anode, and a metal focusing ring extending around the anode for enhancing the uniformity of the plasma. The screws are located a maximum distance away from the focusing ring and the electric RF field. The screws are preferably covered with caps of electrically insulative material. Furthermore, the metal of the focusing ring is preferably anodized. The screws can be of an anodized metal or of an insulating material.

All of these measures help the present invention achieve the above-mentioned object of preventing the occurrence of micro-arcing during the etching process and hence, prevent contaminants from being produced.

The confinement ring functions as a physical barrier that confines the plasma stream to within the projected area of the wafer. To this end, the height of the confinement ring (distance by which the confinement ring protrudes downwardly from the cathode) is selected to be 7~9 mm. The confinement ring is preferably formed of ceramic or at least of a material such as anodized aluminum and quartz which will not be damaged by the plasma. Furthermore, the confinement ring can have a TEFLON (polytetrafluoroethylene) coating to reduce the friction between the cathode and the confinement ring. All of these measures help the present invention achieve the above-mentioned second object of the present invention of preventing the contamination of the wafer.

BRIEF DESCRIPTION OF THE DRAWINGS

The above and other objects and advantages of the present invention will become more apparent from the following detailed description of a preferred embodiment thereof made with reference to the attached drawings, of which:

FIG. 5 is a graph showing the relationship between the time during which RF power is supplied and the generation of particle contaminants, when the conventional dry etching apparatus of FIG. 1 is used.

DETAILED DESCRIPTION OF THE PREFERRED EMBODIMENTS

Figure 1:
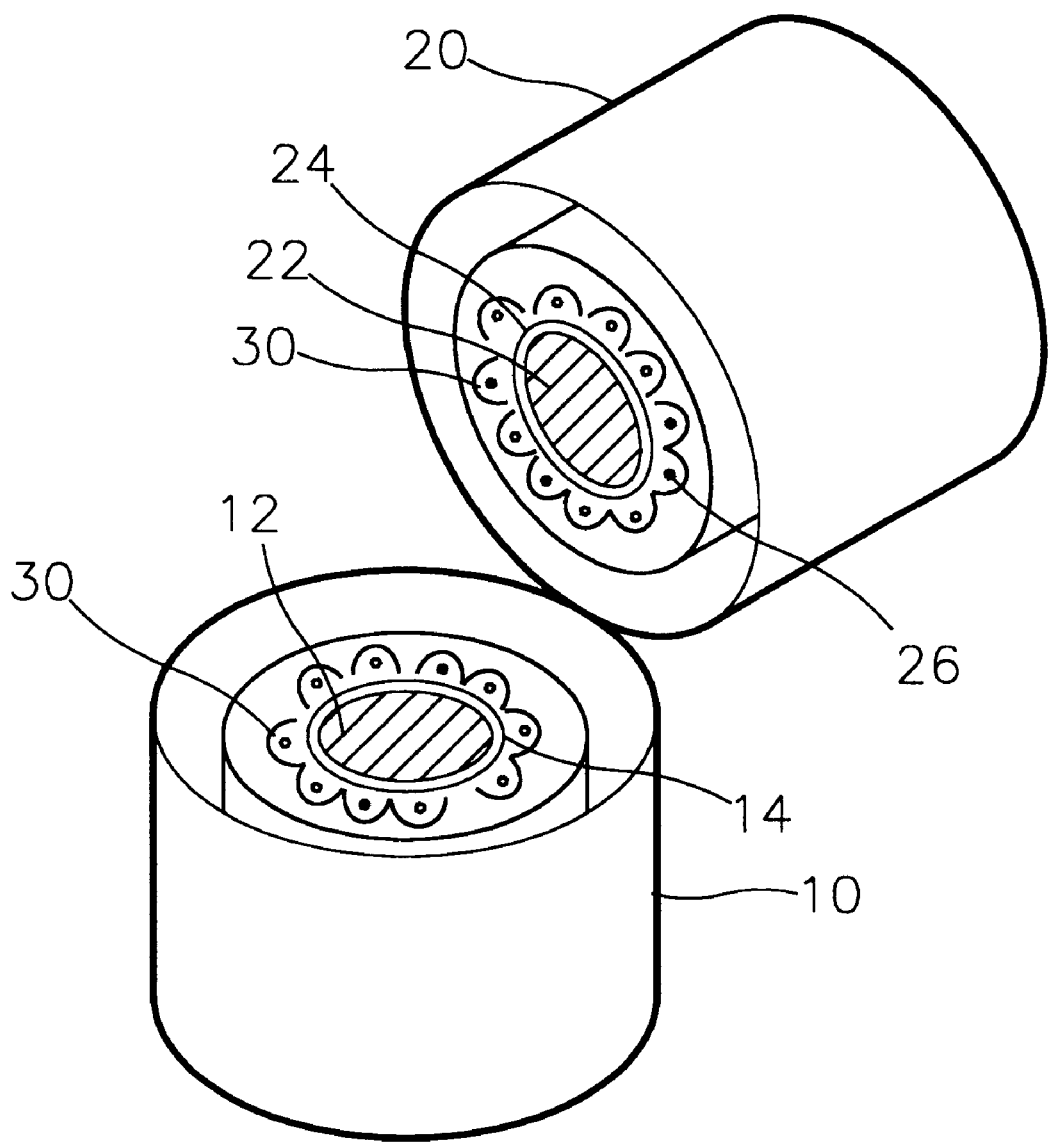
FIG. 1 is a perspective view of a conventional dry etching apparatus showing polymer and contamination particles formed therein.

The present invention will now be described more fully hereinafter with reference to the accompanying drawings. In the drawings, the size and relative position of the elements of the dry etching apparatus are exaggerated for clarity. Furthermore, like numbers refer to like elements throughout the drawings.

Figure 2:
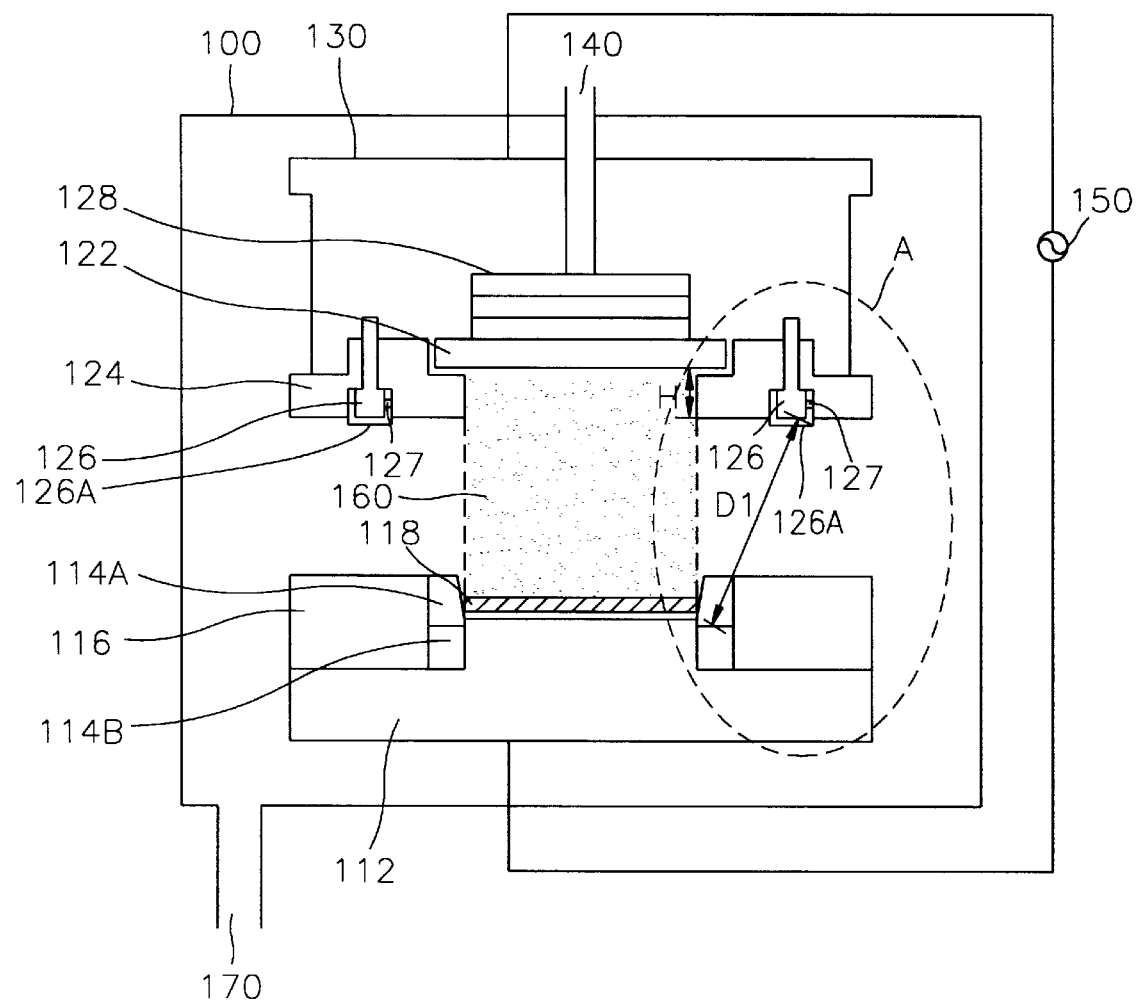
FIG. 2 is a sectional view of one embodiment of the dry etching apparatus according to the present invention.

Referring first to FIG. 2, an electrostatic chuck (ESC) 112 capable of holding a wafer 118 serves as an anode. The ESC 112 is disposed in the bottom portion of a processing chamber 100 of the dry etching apparatus. Rings 114A, 114B and 116 extend around a peripheral portion of the ESC 112. The ring 114B is made of metal and is a focusing ring primarily responsible for ensuring that the plasma density is uniform. This focusing ring 114B may be made of pure aluminum, but is preferably made of anodized aluminum or stainless steel, to suppress micro-arcing. The ring 114A extends over the top of the metal focusing ring 114B and serves as an insulating ring to prevent the ring 114B from being directly exposed to the plasma and to prevent arcing. The ring 116 extends over the periphery of the metal focusing ring 114B and the insulating focusing ring 114A and also serves as an insulating ring. The wafer 118 which is to be dry etched is loaded on the ESC 112, and the rings 114A and 116 help to maintain the wafer 118 in place.

A cathode 122 and a baffle 128 stacked thereon are disposed in the top portion of the processing chamber 100 of the dry etching apparatus. A confinement ring 124 supports the cathode 122 in position in the upper portion of the processing chamber 100 of the dry etching apparatus. The confinement ring 124 protrudes downward from the cathode 122 by a predetermined height 'H' to confine the plasma to an area corresponding to the projected area of the wafer 116. The confinement ring 124 is formed of ceramic or any other material which is not damaged by plasma, e.g., anodized aluminum or quartz. The confinement ring 124 is also preferably coated with an insulating material such as TEFLON (a smooth, heat resistant/scratch resistant polymer coating) to reduce the friction between the silicon cathode 122 and the confinement ring 124 and thus, to prevent silicon particles from being generated by the rubbing of the silicon cathode 122 and the confinement ring 124.

The confinement ring 124 is fixed to an upper sealing plate 130 by screws 126. The screws 126 are located a maximum distance D1 away from the focusing ring 114B, and are spaced from the radio frequency (RF) electric field region, i.e., from the region in which the plasma is formed. The screws 126 are made of an anodized metal to prevent micro-arcing or of an insulating material such as TEFLON. When the screws 126 are made of metal, a respective insulating cap 126A preferably covers each of the screws 126 to prevent a certain amount of micro-arcing from occurring. Each insulating cap 126A preferably has a vacuum hole 127 extending horizontally therethrough, i.e., parallel to the focusing ring 114B, to vent the internal space between the screw 126 and the confinement ring 124 or upper sealing plate 130 after the dry etching process is completed.

The dry etching apparatus also includes a gas inlet 140 through which a reaction gas is introduced into the processing chamber at the top portion thereof, and a gas outlet 170 through which the reacted gas is exhausted from the processing chamber 100 at the bottom portion thereof. Also, an RF power supply 150 is connected to the cathode 122 and the anode 112.

When the reaction gas is injected into the gas inlet 140 and the power is applied to the cathode 122 and the anode 112 by the RF power supply 150, an RF electrical field is formed between the cathode 122 and the anode 112 and the reaction gas is converted to plasma 160 by the RF electrical field. The plasma 160 impinges the wafer 118 supported on the anode 112, thereby dry etching the wafer 118.

Figure 3:
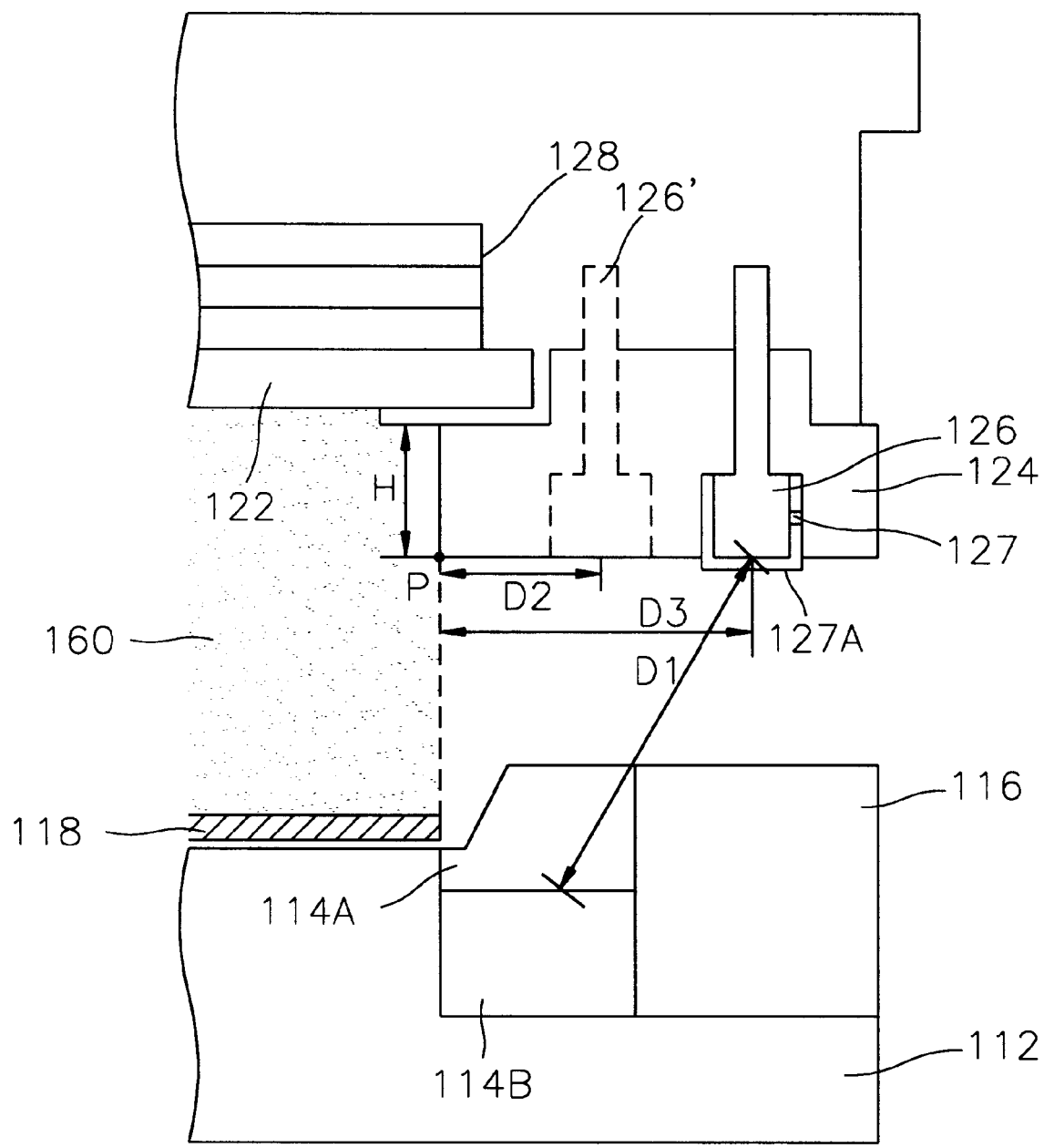
FIG. 3 is an enlarged view of a section of the dry etching apparatus encircled by 'A' in FIG. 2.

The confinement ring 124, and the location of the screws 126 relative to the rings 114A, 114B and 116, will now be described in more detail with reference to FIG. 3.

The degree to which the plasma is confined to the area of the wafer 118 is a function of the amount by which the confinement ring 124 protrudes downward from the cathode 122 (physical barrier height 'H'). Thus, the confinement ring 124 of the present invention has a physical barrier height 'H' which ensures that the plasma impinges only the wafer 118. For instance, when all other elements of the dry etching apparatus have the same sizes as those of the conventional dry etching apparatus, the physical barrier height of the confinement ring of the present invention is 7~9 mm, which is 2~4 mm higher than the physical barrier height (5 mm) of the conventional confinement ring.

The screws 126 which fix the confinement ring 124 to the upper sealing plate 130 are disposed outside the region in which the RF electrical field is formed but at locations at which the screws 126 still, of course, have the ability to keep the confinement ring 124 assuredly fixed to the upper sealing plate 130. More specifically, each screw 126 is located the maximum distance D3 away from a respective location P on the inner peripheral edge of the confinement ring 124, as taken along a line extending in the radial direction of the confinement ring 124 through P and the screw. This location P is directly opposite an end portion of the ESC 112 where the edge of the wafer 118 lies. Each screw 126 is thus also located a maximum distance D1 away from the focusing ring 114B. When the sizes of elements of the dry etching apparatus according to the present invention are the same as those of the conventional dry etching apparatus, the screws 126 are each located 2~5 mm further outside of the RF electrical field than the screws of the conventional dry etching apparatus. For instance, when a distance D2 between the screw 126' and the location P of the confinement ring 124 in the conventional dry etching apparatus is 7 mm, the distance D3 between the screw 126 and the position P of the confinement ring 124 of the present invention is 9~12 mm. Even if the screws 126 of the present invention are slightly affected by the electric field, micro-arcing is suppressed because the distance D1 between each screw 126 and the metal ring 114B is maximized.

A comparison between the present invention and the conventional dry etching apparatus will now be described.

First, the number of particle contaminants generated during a dry etching process performed by a dry etching apparatus according to the present invention was measured.

A wafer 118 having a 1500 Å thick oxide layer was chucked by the ESC 112 of the dry etching apparatus shown in FIG. 2, and then $CF_4$, $CHF_3$ and Ar were injected into the processing chamber through gas inlet 140. Then, plasma was generated by applying the RF power to the cathode 122 and the anode 112 with the RF power supply 150 to etch the oxide layer. While the RF power was being applied, the number of particles generated in the dry etching apparatus was measured at predetermined time intervals during a period of time from 0 minutes to 3750 minutes. The results are shown in the graph of FIG. 4.

Next, the conventional dry etching apparatus shown in FIG. 1 was operated under the same conditions, and the number of particles generated in the conventional dry etching apparatus was also measured at predetermined time intervals. The results of these measurements are shown in the graph of FIG. 5.

Figure 4:
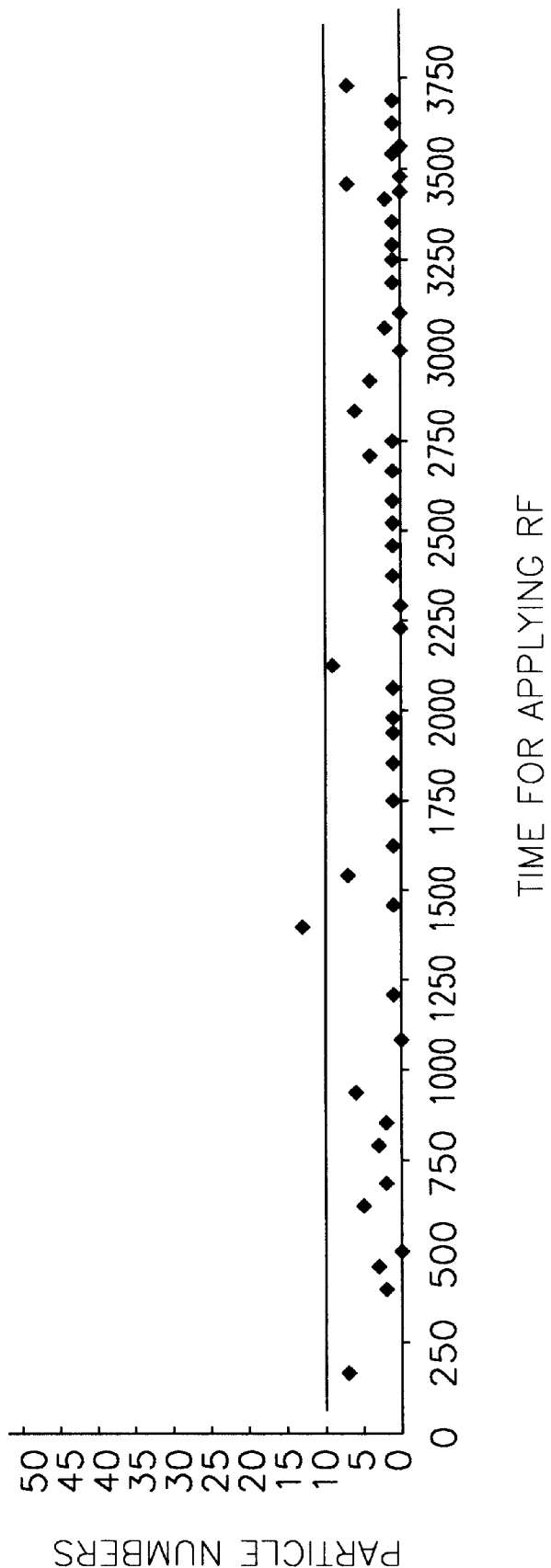
FIG. 4 is a graph showing the relationship between the time during which RF power is supplied and the generation of particle contaminants, when the dry etching apparatus of FIG. 2 is used.

As shown in FIG. 4, the number of particle contaminants generated in the dry etching apparatus of the present invention is almost always less than 10. On the other hand, as is clear from FIG. 5, the number of particle contaminants generated in the conventional dry etching apparatus is oftentimes greater than 10 and at times ranges to more than 50.

According to the dry etching apparatus of the present invention, the screws 126 for fixing the confinement ring 124 to the upper sealing plate 130 are located at positions which ensure a sufficient securing of the confinement ring 124 to the sealing plate 130, which are outside of an RF electric field, and which are a maximum distance D1 away from the metal focusing ring 114B. Thus, micro-arcing will not occur between the screws 126 and the focusing ring 114B during the dry etching process. Also, the screws 126 are provided with insulating caps, an insulating ring(s) is/are provided over the metal focusing ring 114B, and the screws 126 and the focus ring 114B are made of an anodized metal to effectively suppress the micro-arcing. Also, the physical barrier height of the confinement ring 124 is precisely set to ensure that the plasma impinges only the wafer 118, and not the focusing ring. Thus, when using the dry etching apparatus of the present invention, micro-arcing does not occur and the plasma is only distributed onto the wafer, whereby the generation of particle contaminants is suppressed and the yield of the products produced by the dry etching process is kept high.

Although the present invention has been described above with respect to the preferred embodiment thereof, various changes thereto and variations thereof will become apparent to those of ordinary skill in the art. Accordingly, all such changes and modifications are seen to be within the true spirit and scope of the present invention as defined by the appended claims.

What is claimed is:

1. A dry etching apparatus comprising:

a processing chamber in which plasma is produced;

a plate fixed in place at an upper portion of said processing chamber;

a wafer chuck disposed at a lower portion of said processing chamber;

a metal focusing ring extending around a portion of the chuck for enhancing the uniformity of the density of the plasma;

a cathode disposed at an upper portion of the dry etching apparatus, facing said chuck and spaced apart from said chuck by a predetermined distance;

a confinement ring supporting said cathode at an outer peripheral portion of said cathode and protruding downwardly from said cathode;

a plurality of metal screws fixing said confinement ring to said plate;

caps of electrically insulating material covering said screws, wherein each of said caps has a vacuum hole extending horizontally therethrough; and an RF power source connected to said anode and said cathode so as to produce an RF electric field therebetween, and wherein said screws are located outside a region in which the RF electric field is produced.

2. The apparatus of claim 1, wherein said metal ring is of an anodized metal.

3. The apparatus of claim 1, wherein said confinement ring protrudes 7 to 9 mm downwardly from said cathode.

4. The apparatus of claim 1, wherein said confinement ring is of a material selected from the group consisting of ceramic, anodized aluminum and quartz.

5. The apparatus of claim 1, wherein said confinement ring has a smooth heat resistant/scratch resistant polymer coating.

6. The apparatus of claim 1, wherein each of said screws is located 9 to 12 mm away from an inner peripheral edge of said confinement ring as taken along a line extending radially of said confinement ring and intersecting the screw.

\* \* \* \* \*